United States Patent [19]

Kagiwada et al.

[11] 4,290,033
[45] Sep. 15, 1981

[54] SHALLOW BULK ACOUSTIC WAVE DEVICES EMPLOYING ENERGY TRAPPING

[75] Inventors: Reynold S. Kagiwada, Los Angeles; Kuo-hsiung Yen, Manhattan Beach; Kei-fung Lau, Harbor City, all of Calif.

[73] Assignee: TRW Inc., Redondo Beach, Calif.

[21] Appl. No.: 45,159

[22] Filed: Jun. 4, 1979

[51] Int. Cl.³ .................. H03H 9/54; H03H 9/64; H03H 9/30

[52] U.S. Cl. .................. 333/141; 333/147; 333/153; 333/194; 333/195

[58] Field of Search .................. 333/150–155, 333/193–196, 186–188, 141–143; 310/313, 365, 366, 313 R, 313 A, 313 B, 313 C, 313 D; 29/594, 25.35; 331/107 A

[56] References Cited

U.S. PATENT DOCUMENTS

| | | | |
|---|---|---|---|
| 3,736,587 | 5/1973 | Bush et al. | 333/150 X |
| 3,950,713 | 4/1976 | Lewis | 333/151 |
| 4,159,435 | 6/1979 | Lewis | 333/154 X |
| 4,204,178 | 5/1980 | Mitchell | 333/194 |

FOREIGN PATENT DOCUMENTS 2000409 1/1979 United Kingdom ............... 333/195

OTHER PUBLICATIONS

Browning et al.–"New Family of Bulk-Acoustic-Wave Devices Employing Interdigital Transducers" in Electronic Letters, Mar. 3, 1977, pp. 128–130.

Lewis–"Surface Skimming Bulk Waves", 1977 Ultrasonics Symposium Proceedings, IEEE Cat. #77CH1264-1SU; pp. 744–752.

Browning et al.–"Bandpass Filters Employing Surface Skimming Bulk Waves", 1977 Ultrasonics Symposium Proceedings, IEEE Cat. #77CH1264-1SU; pp. 753–756.

Primary Examiner—Marvin L. Nussbaum
Attorney, Agent, or Firm—John J. Connors; Donald R. Nyhagen; Noel F. Heal

[57] ABSTRACT

Energy trapping elements for use with shallow bulk acoustic wave devices of various kinds, to minimize the insertion loses in such devices due to spreading of electroacoustic energy into the crystal substrate upon which the devices are constructed. Electroacoustic energy propagated in a substrate is trapped close to the surface of the substrate by means of trapping elements comprising a plurality of strips or grooves disposed on the surface of the substrate in the path of the propagated energy, and oriented approximately perpendicularly to the direction of propagation. The spacing of the elements is such that their stop-band frequency, at which energy will be reflected, is substantially different from the characteristic center frequency of the entire device, in order that the elements will serve a purely trapping function and not a reflecting function.

20 Claims, 9 Drawing Figures

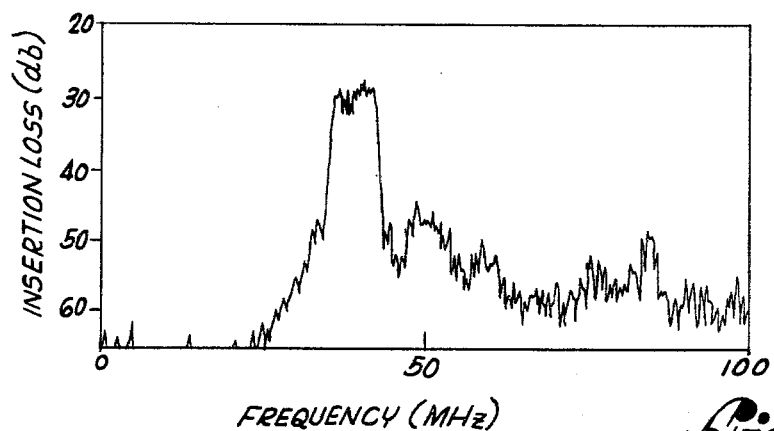
Fig. 3b
Fig. 4
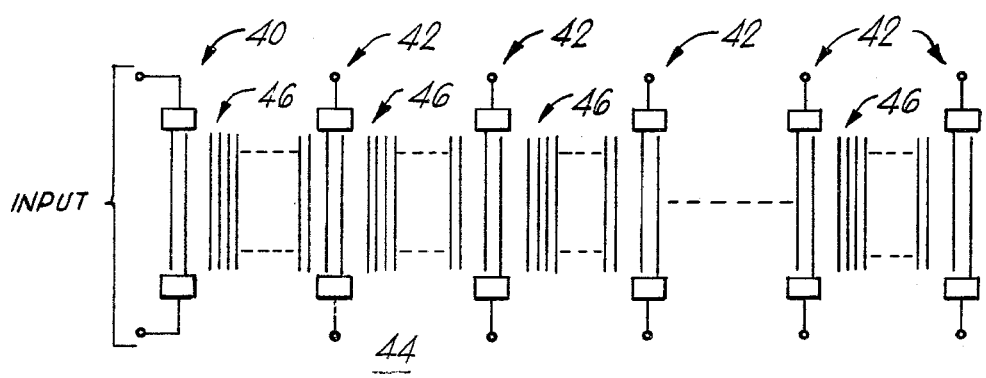
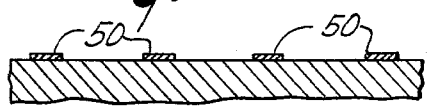
Fig. 5a
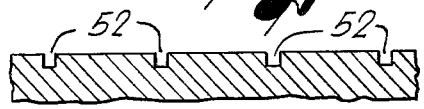
Fig. 5c
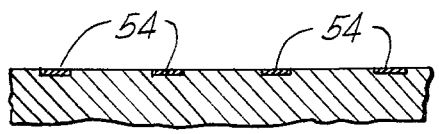
Fig. 5b
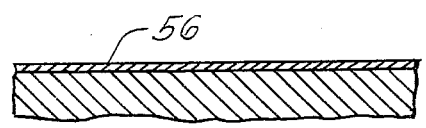
Fig. 5d

SHALLOW BULK ACOUSTIC WAVE DEVICES EMPLOYING ENERGY TRAPPING

BACKGROUND OF THE INVENTION

This invention relates generally to acoustic wave devices, and, more particularly, to a variety of acoustic wave devices employing shallow bulk acoustic waves, such as delay lines, oscillators, and filters. Since shallow bulk acoustic wave devices have resulted from relatively recent developments in the acoustic wave device field, it may be helpful to summarize these developments before turning to the particular problem with which the present invention is concerned.

In recent years, much research has been performed in the development of acoustic wave devices, primarily for use in communications and radar systems. There has been a trend in such systems toward operation at increasingly higher carrier frequencies, principally because the spectrum at lower frequencies is becoming relatively congested, and also because the permissible bandwidth is greater at higher frequencies. Congestion of the frequency spectrum is further aggravated by the use of spread spectrum techniques, in which a normally narrowband information signal is spread over a relatively wide band of frequencies, to provide enhanced immunity to noise and interference. Piezoelectric crystals have provided the basis for devices such as oscillators, resonators and filters, operating at very high radio frequencies, but piezoelectric crystals used in conventional modes of operation cannot conveniently meet the demand for higher frequencies in modern systems.

It has been known for some time, of course, that certain crystalline materials have piezoelectric properties. In particular, there is what is sometimes referred to as the direct piezoelectric effect, wherein electrical charges appear on crystal surfaces upon the application of an external stress. There is also a converse piezoelectric effect, wherein the crystal exhibits strain or deformation when an electrical charge is applied by external means to faces of the crystal. These effects have been employed for many years in crystal oscillators and other devices in which bulk acoustic waves are transmitted through a crystal, typically between electrode plates located at opposite faces of the crystal. Use of bulk waves in this manner has provided crystal oscillators and filters with relatively good temperature stability, but with frequencies limited to approximately 200 megahertz (MHz), in a harmonic mode of operation, and more typically falling below 40 MHz, in a fundamental mode. Consequently, higher frequencies cannot be obtained without the expense of additional components, such as frequency multipliers.

In recent years, piezoelectric crystals utilizing surface acoustic waves, rather than bulk acoustic waves, have been developed, with frequencies of operation between 10 MHz and approximately 2 gigahertz (GHz). These surface acoustic wave devices, or "SAW" devices, have a number of advantages over the older bulk acoustic wave devices. In addition to their higher frequency of operation, SAW devices can be designed to have a weighted frequency response. Moreover, they have an operating frequency that is independent of crystal dimensions, and they have a planar structure that is mechanically rugged and can be readily fabricated using conventional semiconductor metalization techniques.

SAW devices utilize interdigital transducers for converting electrical energy into acoustic or mechanical energy, and vice versa. Basically, these transducers comprise metalized layers formed on the crystal surface in finger-like configurations, like the teeth of a comb. The finger-like elements are usually arranged in two sets, with the fingers in the two sets extending in opposite directions, in an interleaved fashion, from respective elongated pads known as sum bars. When an electrical signal is applied to such a transducer, across the sum bars of the two sets of fingers, a surface acoustic wave, also known as a Rayleigh wave, is launched in a direction perpendicular to the transducer fingers. When the surface acoustic wave encounters a second, similarly structured transducer, it is transformed back into an electrical output signal. Typically, a transmitting or input transducer in such a device is excited by an oscillatory electrical signal, either in a continuous-wave (CW) mode, or in a pulsed mode of operation.

The frequency of operation of a surface acoustic wave device depends largely on the size and geometry of the transducers. Although an electroacoustical transducer will convert an input electrical signal to an acoustic wave of the same frequency, the transducer has a high insertion loss at frequencies outside a band of frequencies determined by the transducer geometry. A SAW device transducer operates, in effect, with a bandpass filter, the center frequency of which is determined by the spacing between pairs of transducer fingers, and the pass-band width of which is controllable to some degree by the number of pairs of fingers in the transducer. Generally, a transducer with many pairs of fingers will have a narrow-band frequency response, while one with few pairs of fingers will have wideband frequency response.

Since the spacing of the transducer fingers is directly proportional to the wavelength at operating frequencies, and since the velocity of the acoustic wave is equal to the product of its frequency and its wavelength, it follows that the operating frequency of an acoustic wave device using a particular interdigital transducer is dependent only on the velocity of the acoustic wave. Moreover, since wave velocities in SAW devices are limited by the properties of available crystals, extremely small wavelengths would be required to produce very high frequency devices. To obtain such small wavelengths, interdigital transducers having very small finger spacings must be constructed. However, the fabrication techniques typically used in the manufacture of transducers are those of photolithography, as employed in metalization processes in semiconductor manufacture, and one major problem in further reducing the size of interdigital transducers is that the resolution obtainable in these techniques is limited by the wavelength of the light employed in the photolithographic process.

Another problem with SAW devices is that bulk acoustic waves are often launched into the crystal at the same time as the surface acoustic waves. The bulk waves tend to cause spurious frequency responses that significantly affect the operational integrity of the devices. Furthermore, since the devices utilize a surface acoustic wave, they are sensitive to surface contamination. SAW devices also have relatively poor temperature stability, i.e., their frequency of operation varies substantially with temperature. Temperature changes affect the elastic constants relating stress to strain in crystals, and therefore affect the velocity of wave propagation to some degree, depending on the crystal material, type of crystal cut, and direction of propagation.

Temperature also affects the physical size of the crystal, and therefore affects finger spacings and propagation delay times. Although some piezoelectric materials, such as ST-cut quartz, have good temperature stability properties, they have a low piezoelectric coupling coefficient, and therefore do not permit effficient generation of surface acoustic waves. SAW devices also have a long term aging problem, due principally to accumulation of surface contamination, and possibly due to gradual relaxation of surface stress conditions caused by surface imperfections.

By way of further background, it is of interest to note that piezoelectricity has been demonstrated in many different crystal materials, but only a few such materials are used in practical transducer design. In both the direct and converse piezoelectric effects, the mechanical strains and stresses are related to electrical parameters, such as charge, voltage and polarization, by constants of proportionality which are referred to as the piezoelectric constants. There are different constants for different directions in the crystal. Furthermore, the mechanical stresses and strains within a crystal are related to each other by elastic constants, there again being different constants for the different directions in the crystal. In the most general case, there are eighteen piezoelectric stress constants and eighteen piezoelectric strain constants, although not all eighteen constants of each type exist in every piezoelectric material. For example, in quartz, one of the most commonly used piezoelectric materials, only five constants have non-zero values, and, by utilizing properties of symmetry within the crystal, only two such constants need be determined in order to completely define the properties of the crystal.

An important parameter in the study of acoustic wave phenomena is the electromechanical coupling coefficient for various types of waves. The efficiency with which electrical energy is converted into acoustic or mechanical energy by an interdigital transducer is highly dependent upon the orientation of the transducer with respect to the crystallographic axes of the piezoelectric material. When the coupling coefficient is zero, it is virtually impossible to convert an electrical signal into an acoustic wave for transmission in the material. High coupling coefficients, on the other hand, indicate relatively high coupling efficiencies. For example, the coupling coefficient for surface acoustic waves in some cuts of quartz varies from a maximum in one direction of propagation, to zero in another direction.

It has been known for some time that interdigital transducers are sometimes responsible for the propagation of bulk waves into the crystal material, as well as surface waves along the crystal surface. Until recently, researchers in the field concerned themselves with techniques for identifying and eliminating such bulk waves, since they were regarded as a source of interference with surface waves. It has now been demonstrated, however, that bulk shear waves can propagate just beneath the surface of a ceramic material, and can be utilized on their own, if the surface waves can be appropriately suppressed.

In shallow bulk acoustic wave devices, surface waves are suppressed by selecting an appropriate orientation of the transducers with respect to conventionally defined crystallographic axes of the crystal. In some orientations the coupling coefficient for surface acoustic waves is minimized and the coupling coefficient for shallow bulk acoustic waves is relatively large.

The principal advantage of shallow bulk acoustic wave devices over surface acoustic wave devices stems from the higher velocity of propagation of shallow bulk acoustic waves as compared to that of surface acoustic waves. Higher frequencies can be obtained, therefore, without reduction in the interdigital finger spacings. Alternatively, the finger spacings can be made correspondingly larger for the same frequency, in order to facilitate fabrication of the devices. Other advantages are that shallow bulk acoustic wave devices have a lower response to spurious signals of the bulk or surface acoustic wave type, and are less sensitive to surface contamination and surface imperfection than devices of the surface acoustic wave type.

It appears that shallow bulk acoustic waves are not propagated parallel to the surface of the crystal, but rather are propagated into the crystal at a very shallow angle. Consequently, the energy associated with shallow bulk acoustic waves is dispersed further into the bulk of the crystal as the waves travel further from the transmitting transducer. As a result, the insertion loss of a shallow bulk acoustic wave device increases with the separation between the input and output transducers. For applications in which a relatively long delay time is desired, such as in delay lines, this energy spreading causes a significant additional insertion loss, and is detrimental to the device performance. Accordingly, there is a significant need for a shallow bulk acoustic wave device that still retains the inherent advantages of such devices, but minimizes energy spreading into the bulk of the crystal, and therefore reduces the insertion loss of the device. The present invention satisfies this need.

SUMMARY OF THE INVENTION

The present invention resides in a shallow bulk acoustic wave device having means for trapping the electroacoustic energy close to the surface of the crystal, and thereby reducing the insertion loss and extending the usefulness of shallow bulk acoustic waves to include devices with relatively long time delays.

Briefly, and in general terms, the invention is embodied in a shallow bulk acoustic wave device having a piezoelectric substrate, and at least one sending and one receiving transducer disposed on the substrate surface in such a manner as to minimize coupling of surface acoustic waves, while providing substantial coupling of shallow bulk acoustic waves. The device of the invention further includes means disposed between the receiving transducer and the sending transducer, for trapping the acoustic energy close to the surface of the substrate. The means for trapping the acoustic energy close to the surface of the substrate can be any mechanical or electrical structure for changing the surface boundary conditions in the propagation medium. This structure may be a metallic grating disposed on the surface of the substrate in the path of the shallow bulk acoustic waves, and in a substantially perpendicular relationship to the direction of propagation, or may be a mechanical discontinuity, such as an array of grooves on the surface, or a layer of different material on the surface. In each case, the surface structure presents a change in the surface boundary conditions of the shallow bulk acoustic waves, and has the effect of trapping energy closer to the surface. The energy trapping means of the invention can be employed in virtually every type of shallow bulk acoustic wave device, but can be most usefully employed in such devices having relatively long time delays from input to output. Devices with shorter time delays will have less need for an energy trapping device, since the distance between the sending and receiving transducers will be less.

By way of example, one embodiment of the invention disclosed herein includes a shallow bulk acoustic wave delay line fabricated on 37° rotated Y-cut lithium niobate (LiNbO$_3$). This device comprises two transducers separated by a multistrip coupler, and two gratings, each grating having a plurality of metallic strips disposed between the transducers and the coupler. By way of further example, another device embodying the invention is a delay line comprising a substrate fabricated from ST-cut quartz, and sending and receiving transducers oriented 90° from the X axis. Between the transducers, a grating with a plurality of metallic strips is disposed on the surface of the substrate, to substantially reduce the insertion loss of the device. In another embodiment of the invention, a tapped delay line employs a number of energy trapping gratings spaced along its length, to reduce the insertion loss between a sending transducer and a number of receiving transducers.

It will be apparent from the foregoing that the present invention represents a significant advance in the field of shallow bulk acoustic wave devices. In particular, the inherent advantages of shallow bulk acoustic wave devices can be retained and the operation of such devices can be extended to applications requiring relatively long delay times, such as delay lines, without the disadvantage of increased insertion losses. Other aspects and advantages of the invention will become apparent from the following more detailed description, taken in conjunction with the accompanying drawings.

BRIEF DESCRIPTION OF THE DRAWINGS

FIG. 3b is a graph similar to FIG. 3a, but without the energy trapping elements;

FIG. 4 is a simplified plan view of a tapped delay line employing energy trapping elements in accordance with the present invention; and FIGS. 5a-5d are simplified cross-sectional views of alternative forms of energy trapping structures.

DESCRIPTION OF THE PREFERRED EMBODIMENTS

Figure 1:
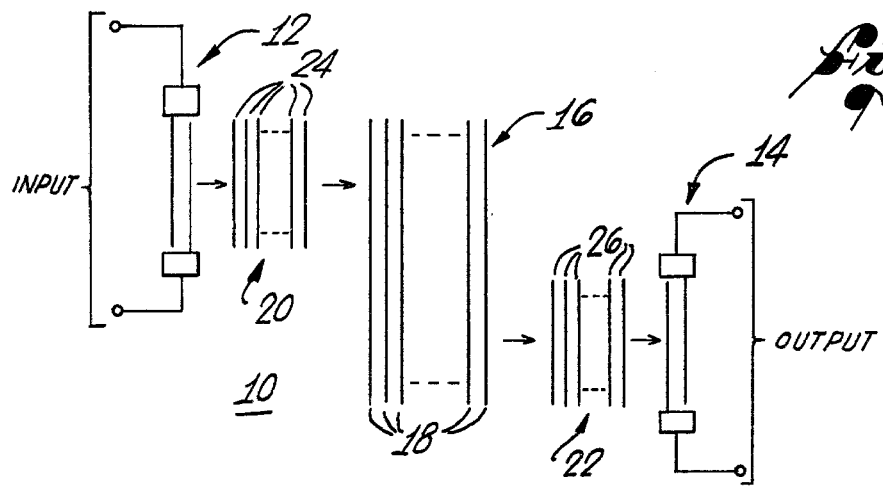
FIG. 1 is a simplified plan view of a delay line and coupler, including two sets of energy trapping elements configured in accordance with the present invention.

As shown in the drawings for purposes of illustration, the present invention is concerned with improvements in shallow bulk acoustic wave devices, particularly such devices that may be used for providing relatively long time delays between input and output. As is now known, shallow bulk acoustic wave devices have some extremely desirable characteristics. However, when these devices are employed to provide relatively long delay times, they suffer from the disadvantage of relatively high insertion loss, as a result of energy spreading into the bulk of the substrate on which the devices are constructed.

In accordance with the present invention, a shallow bulk acoustic wave device includes energy trapping elements, which are effective to trap the electroacoustic energy of the shallow bulk acoustic wave relatively close to the surface of the substrate, and thereby provide a more desirable, low insertion loss.

As shown by way of example in FIG. 1, the invention may be applied to a delay line employed as a bandpass filter. This shallow bulk acoustic wave device includes a piezoelectric substrate, indicated by reference numeral 10, a sending interdigital transducer 12, and a receiving interdigital transducer 14. Both transducers are of conventional construction, but may be weighted or apodized by providing selective overlap of the transducer fingers. Interposed between the sending and receiving transducers 12 and 14 is a multistrip coupler 16, comprising a set of uniformly spaced metallic strips, indicated at 18. The strips 18 are substantially perpendicular to the direction of propagation from the sending transducer 12 and are utilized to couple all or selected portion of the energy laterally, along the strips, for re-transmission to the receiving transducer along a laterally off-set transmission path. This combination of a multistrip coupler and two interdigital transducers is extremely frequency sensitive, and can be utilized as a highly efficient bandpass filter at very high frequencies. The strips 18, while shown as uniformly spaced and of equal length, may be structured to form a weighted grating.

In order to minimize energy loss by spreading of acoustic energy into the bulk of the crystal substrate 10, the device further includes two energy trapping gratings 20 and 22, each comprising a plurality of parallel metallic strips 24 and 26. The gratings 20 and 22 are positioned between the respective transducers 12 and 14 and the multistrip coupler 16. The energy trapping strips 24 and 26 are also oriented approximately perpendicularly with respect to the direction of propagation. As is well known from surface acoustic wave technology, a uniformly spaced grating of metallic strips in the path of an acoustic wave can function as a reflector of the electroacoustic energy falling within a limited frequency band. However, the spacing of the strips 24 and 26 used in the energy trapping gratings 20 and 22 of the invention is such that the stop band of each the gratings is approximately 1.25 times the center frequency of the filter device in which the energy trapping gratings are employed. Accordingly, the gratings 20 and 22 do not have any significant reflective effect on a frequency within the passband of the device.

Figure 3A:
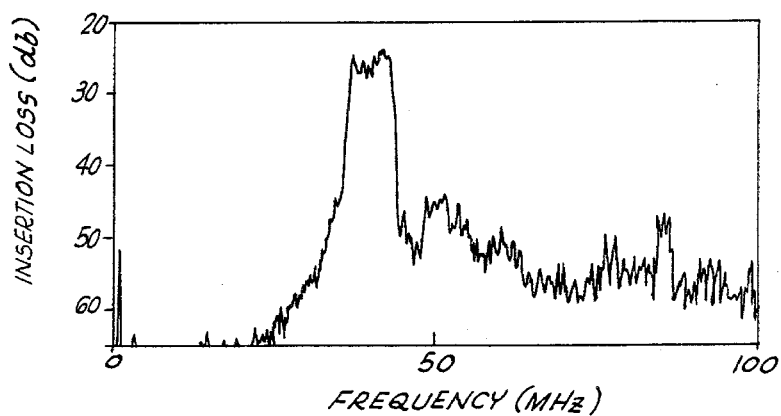
FIG. 3a is a graph showing the insertion loss of the device illustrated in FIG. 1, plotted with respect to frequency.

In one experiment involving the configuration shown in FIG. 1, the substrate employed was 37° rotated Y-cut lithium niobate (LiNbO$_3$), the transducers 12 and 14 were weighted, the gratings 20 and 22 each consisted of 39 metallic strips, and the multistrip coupler employed 27 metallic strips. The frequency response of this device was measured and is shown in FIG. 3a. The same response characteristic was again measured with the energy trapping metallic strips 24 and 26 completely removed, so that only the coupler 16 remained interposed between the two weighted transducers 12 and 14. This frequency response is shown by way of comparison in FIG. 3b, in which it will be apparent that the trapping configuration provides an improvement in insertion loss of approximately 4 dB over the configuration without the trapping elements.

Figure 2:
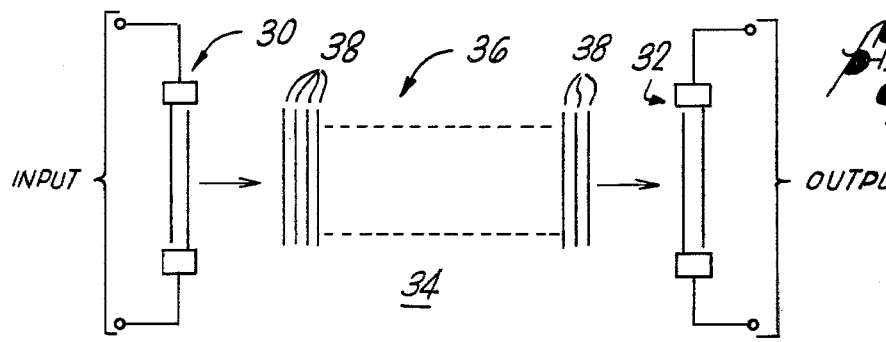
FIG. 2 is a simplified plan view of a delay line employing the energy trapping device of the invention.

As shown in FIG. 2, the invention can also be employed in a delay line or filter not having a multistrip coupler. The device illustrated diagrammatically in FIG. 2 has a conventional sending transducer 30 and receiving transducer 32, disposed on a substrate 34, of quartz, specifically ST-cut quartz with the transducers oriented at 90° from the X axis. An energy trapping grating 36, comprising 100 metallized strips 38, is interposed between the two transducers. Again, the grating stop band is selected to be 1.25 times the center frequency of the device. In this case the insertion loss without the metallized grating is approximately 10 dB greater than the insertion loss of the configuration employing trapping elements.

As further illustrated in FIG. 4, trapping elements of the type with which this invention is concerned may be usefully employed in tapped delay lines utilizing shallow bulk acoustic waves. The delay line shown in FIG. 4 has a sending transducer 40 and a plurality of receiving transducers 42, spaced along a propagation path from the sending transducer, on a substrate 44. An energy trapping grating 46 is disposed in the propagation path before each receiving transducer. Delay lines of this kind are frequently employed as correlators, in which the magnitude of the received signal at tapped positions in the delay line is of extreme importance in the operation of the device. Without energy trapping, successive outputs from the tapped delay line are subject to successively higher insertion losses. It will be apparent, therefore, that the use of energy trapping elements greatly improves the performance of these devices, and reduces the need for compensation by other means for errors due to insertion losses that increase over the length of the delay line.

As described above, and as illustrated in FIG. 5a, the energy trapping elements of the invention can take the form of a grating of parallel conductive strips, indicated at 50, on the surface of the substrate. However, the same energy trapping function could be performed using dielectric material for the strips 50, or by an array of grooves, as shown at 52 in FIG. 5c, forming a mechanical discontinuity in the substrate surface. Likewise, conductive or dielectric strips 54 could be embedded beneath the substrate surface, as shown in FIG. 5b. Another form of discontinuity performing an energy trapping function can be provided by means of a continuous layer 56, as shown in FIG. 5d, which may be of a dielectric or metallic material. The layer 56 serves to change the acoustic and electrical boundary conditions at the surface.

It will be appreciated from the foregoing that the present invention represents a significant advance in the field of acoustic wave devices, and particularly in the field of shallow bulk acoustic wave devices. Specifically, the invention provides a hitherto unavailable technique for trapping electroacoustic energy close to the surface of the substrate of the device, and thereby reducing insertion losses, especially in devices involving relatively long time delays between input and output. It will also be apparent that, although particular devices utilizing shallow bulk acoustic waves have been described in detail for purposes of illustration, the invention has application to practically all types of shallow bulk acoustic wave devices. Accordingly, the scope of the invention is not intended to be limited to the applications described and illustrated, but only by the appended claims.

We claim:

1. A shallow bulk acoustic wave device, comprising:
a piezoelectric substrate having a surface;
at least one sending transducer and at least one receiving transducer, both disposed on said substrate surface in such a manner as to provide substantial coupling of shallow bulk acoustic waves and negligible coupling of surface acoustic waves; and
means for trapping electroacoustic energy close to said substrate surface, to reduce spreading of the energy into the substrate and thereby reduce insertion loss of the device.

2. A shallow bulk acoustic wave device as set forth in claim 1, wherein said means for trapping electroacoustic energy include a plurality of strips disposed on said surface in the path of shallow bulk acoustic waves propagated from said sending transducer.

3. A shallow bulk acoustic wave device as set forth in claim 2, wherein said strips are conductive, parallel, substantially perpendicular to the direction of propagation, and spaced to provide a stop-band frequency range substantially different from the characteristic frequency of operation of said device, whereby said conductive strips have practically no reflective effect on the propagated energy.

4. A shallow bulk acoustic wave device as set forth in claim 3, wherein said strips are spaced to provide a stop-band frequency range approximately 25 percent higher in frequency than the characteristic frequency of operation of the device.

5. A shallow bulk acoustic wave device as set forth in claim 1, wherein said means for trapping electroacoustic energy include a plurality of grooves in said surface, positioned in the path of shallow bulk acoustic waves propagated from said sending transducer.

6. A shallow bulk acoustic wave device as set forth in claim 1, wherein said means for trapping the electroacoustic energy include a dielectric layer disposed on said surface between said transducers.

7. A shallow bulk acoustic wave delay line, comprising:
a piezoelectric substrate having a surface;
a sending interdigital transducer disposed on said surface in such a manner as to propagate shallow bulk acoustic waves into said substrate, when energized by an appropriate electrical signal;
a receiving interdigital transducer disposed on said surface in a position to receive the shallow bulk acoustic waves and convert them back into an electrical signal; and
energy trapping means also disposed on said surface, between said sending and receiving transducers, to trap electroacoustic energy close to said surface and minimize spreading of the energy into said substrate.

8. A shallow bulk acoustic wave delay line as set forth in claim 7, wherein said energy trapping means includes a plurality of strips formed on said surface in the propagation path.

9. A shallow bulk acoustic wave delay line as set forth in claim 8, wherein:
said strips are parallel, substantially perpendicular to the propagation path, and spaced to provide a stop-band frequency substantially different from the characteristic response frequency of said delay line.

10. A shallow bulk acoustic wave delay line as set forth in claim 7, wherein said energy trapping means includes a plurality of grooves formed in said surface in the propagation path.

11. A shallow bulk acoustic wave delay line as set forth in claim 7, wherein said energy trapping means includes a layer disposed on said surface in the propagation path.

12. A shallow bulk acoustic wave delay line as set forth in claim 11, wherein said layer is a metal layer.

13. A shallow bulk acoustic wave delay line as set forth in claim 11, wherein said layer is a dielectric layer.

14. A shallow bulk acoustic wave delay line as set forth in claim 7, and further including:
   a multistrip coupler located between said sending and receiving transducers; and
   second energy trapping means, said first energy trapping means being located between said sending transducer and said coupler, and said second energy trapping means being located between said coupler and said receiving transducer.

15. A shallow bulk acoustic wave delay line as set forth in claim 7, and further including:
   at least one additional interdigital receiving transducer spaced along the propagation path on said surface, to provide a tapped output from said delay line;
   at least one additional energy trapping means disposed on said surface before said additional receiving transducer, to trap energy near said surface and thereby minimize spreading of the energy into the substrate and resultant attenuation in said device.

16. A shallow bulk acoustic wave delay line as set forth in claims 14 or 15, wherein said energy trapping means each include a plurality of parallel grooves that are formed in said surface and are in and substantially perpendicular to the propagation path.

17. A shallow bulk acoustic wave delay line as set forth in claims 14 and 15, wherein said energy trapping means each include a plurality of strips formed on said surface in the propagation path.

18. A shallow bulk acoustic wave delay line as set forth in claim 17, wherein said strips are parallel, substantially perpendicular to the propagation path, and spaced to provide a stop-band frequency substantially different from the characteristic response frequency of said delay line.

19. A shallow bulk acoustic wave delay line as set forth in claim 18, wherein said strips are formed of conductive material.

20. A shallow bulk acoustic wave delay line as set forth in claim 18, wherein said strips are formed of dielectric material.

* * * * *